US009376321B2

(12) United States Patent
Jo et al.

(10) Patent No.: US 9,376,321 B2
(45) Date of Patent: Jun. 28, 2016

(54) METHOD AND APPARATUS FOR MANUFACTURING A NANOWIRE

(75) Inventors: Moon-Ho Jo, Pohang-si (KR); Yun-Sung Woo, Pohang-si (KR); Geun-Hee Lee, Pohang-si (KR)

(73) Assignee: POSTECH ACADEMY-INDUSTRY FOUNDATION, Pohang (KR)

( * ) Notice: Subject to any disclaimer, the term of this patent is extended or adjusted under 35 U.S.C. 154(b) by 523 days.

(21) Appl. No.: 12/475,153

(22) Filed: May 29, 2009

(65) Prior Publication Data

US 2010/0304026 A1    Dec. 2, 2010

(51) Int. Cl.
| | |
|---|---|
| *C23C 16/24* | (2006.01) |
| *C01B 33/027* | (2006.01) |
| *C30B 25/00* | (2006.01) |
| *C30B 29/06* | (2006.01) |
| *C30B 29/60* | (2006.01) |

(52) U.S. Cl.
CPC .............. *C01B 33/027* (2013.01); *C23C 16/24* (2013.01); *C30B 25/00* (2013.01); *C30B 29/06* (2013.01); *C30B 29/60* (2013.01)

(58) Field of Classification Search
USPC .......................................... 427/249.1, 248.1
See application file for complete search history.

(56) References Cited

U.S. PATENT DOCUMENTS

| | | | | |
|---|---|---|---|---|
| 4,654,228 A | * | 3/1987 | Komiyama | 427/180 |
| 6,306,734 B1 | * | 10/2001 | Givargizov | 438/478 |
| 6,340,822 B1 | * | 1/2002 | Brown et al. | 257/25 |
| 6,383,923 B1 | * | 5/2002 | Brown et al. | 438/666 |
| 7,160,585 B2 | * | 1/2007 | Delaunay et al. | 427/571 |
| 7,357,018 B2 | * | 4/2008 | Curry et al. | 73/105 |
| 2004/0037767 A1 | * | 2/2004 | Adderton et al. | 423/447.3 |
| 2005/0109280 A1 | * | 5/2005 | Chen et al. | 118/724 |
| 2006/0185595 A1 | * | 8/2006 | Coll et al. | 118/724 |
| 2009/0061217 A1 | * | 3/2009 | Silva et al. | 428/336 |

FOREIGN PATENT DOCUMENTS

WO    WO 2006120449 A1 * 11/2006

OTHER PUBLICATIONS

Sohn et al. Effect of the Temperature Gradient Between a Substrate and its Ambient on the Growth of Vertically-Aligned GaN Nanorods. Journal of Korean Physical Society, vol. 53, No. 2, Aug. 2008, pp. 908-911.*

* cited by examiner

*Primary Examiner* — David Turocy
(74) *Attorney, Agent, or Firm* — Marshall, Gerstein & Borun LLP

(57) ABSTRACT

A method and an apparatus for manufacturing a nanowire are provided. The method for manufacturing a nanowire includes i) providing a source gas into a chamber, ii) controlling the temperature of a substrate received in the chamber separately from the temperature of the source gas, iii) forming a temperature gradient on the substrate, and iv) forming a nanowire having at least one growth condition selected from a group of growth speed and growth direction controlled according to the temperature gradient on the substrate.

7 Claims, 15 Drawing Sheets

METHOD AND APPARATUS FOR MANUFACTURING A NANOWIRE

BACKGROUND OF THE INVENTION (a) Field of the Invention

The present invention relates to an apparatus and method for manufacturing a nanowire. More particularly, it relates to a method and apparatus for manufacturing a nanowire that can arbitrarily control a growth direction of a nanowire, and a manufacturing apparatus using the same.

(b) Description of the Related Art

A method for manufacturing a nanostructure using a bottom-up method has attracted attention. In order to manufacture a nanostructure having a desired characteristic, a technique for controlling the diameter, length, location, and growth direction thereof is required. Here, the nanostructure includes a nanotube and a nanowire.

In order to grow a silicon nanowire on the substrate with a constant angle to the substrate, a complex process for etching or patterning an oxide layer of the substrate is required. In addition, the process is performed in a high vacuum condition in order to prevent the further formation of oxide layer on the substrate.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a method for manufacturing a nanowire having an advantage of controlling a growth direction of the nanowire with respect to a surface of a substrate in a low vacuum condition. In addition, the present invention provides an apparatus for manufacturing a nanowire.

A method for manufacturing a nanowire according to an exemplary embodiment of the present invention includes i) controlling the temperature of a substrate received in the chamber separately from the temperature of the source gas, ii) forming a temperature gradient on the substrate, and iii) forming a nanowire having at least one growth condition selected from a group of growth speed and growth direction controlled according to the temperature gradient on the substrate.

The forming of the temperature gradient on the substrate may control the temperature of a susceptor that is located in a lower portion of the substrate for supporting the substrate. A cooling medium may be provided to the susceptor to cool the substrate by controlling the temperature of the susceptor. The cooling medium may indirectly contact the susceptor. The temperature gradient may be formed on the substrate by controlling at least one of conditions selected from a group of introduction pressure, introduction speed, and the amount of introduction of the cooling medium.

A temperature difference between the substrate and the source gas may be within 100° C. to 200° C. A temperature difference between the substrate and the source gas may be substantially 130° C.

An oxide layer may be formed on the substrate. The forming of the temperature gradient on the substrate may provide a cooling medium to the substrate to cool the substrate while controlling the temperature of the substrate. In the forming of the nanowire on the substrate, the temperature of the substrate may be higher than 0° C. and lower than 600° C. The substrate may include at least one material selected from a group of silicon (Si), glass, quartz, indium-tin oxide (ITO), alumina ($Al_2O_3$), and stainless steel (SUS). When providing the source gas into the chamber, the source gas may be a silicon source gas, and when controlling the temperature of the substrate separately from the temperature of the source gas, the substrate may be a silicon substrate.

An apparatus for manufacturing a nanowire according to another exemplary embodiment of the present invention includes i) a chamber into which a source gas is inserted and ii) a cooling pipe penetrating the chamber and providing a cooling medium to the chamber. The cooling pipe may form a temperature gradient on a substrate disposed inside the chamber by cooling the substrate, and a nanowire having at least one growth condition selected from a group of growth speed and growth direction controlled according to the temperature gradient may be formed on the substrate.

The apparatus for manufacturing a nanowire according to the other exemplary embodiment of the present invention may further include a susceptor disposed in a lower portion of the substrate to support the substrate, wherein the cooling pipe is inserted into the susceptor. The cooling pipe may include i) a pair of first cooling pipe portions penetrating the chamber and ii) a second cooling pipe portion connected to the pair of first cooling pipe portions and inserted into the susceptor. The second cooling pipe portion is circular-shaped, and the center of the circular shape formed by the second cooling pipe portion may match the center of the substrate.

The apparatus for manufacturing a nanowire according to the other exemplary embodiment of the present invention may further include a protection pipe penetrating the chamber and surrounding the first cooling pipe portions. The cooling pipe may be applied to be inserted into the substrate.

According to an embodiment of the present invention, a nanowire of which a growth direction can be arbitrarily controlled with respect to a surface of a substrate is provided. Various materials can be used as the substrate, and a high-quality nanowire of which directivity is controlled in a relatively low vacuum condition can be manufactured by a simplified process. In addition, the entire manufacturing process of the nanowire is shortened, and accordingly, manufacturing cost of the nanowire can be reduced.

DETAILED DESCRIPTION OF THE EMBODIMENTS

Figure 1:
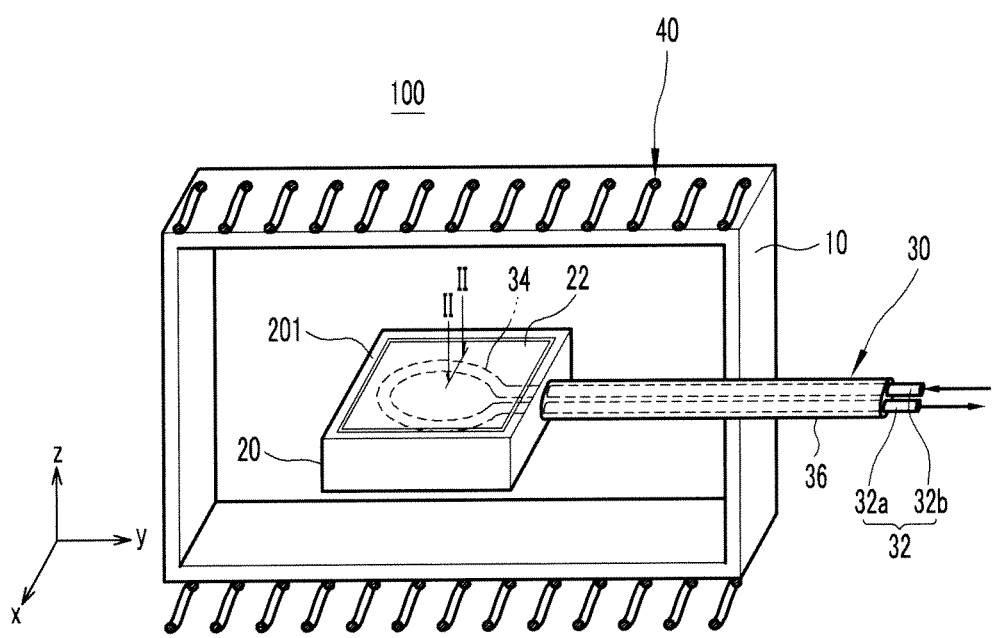
FIG. 1 is a schematic view of an apparatus for manufacturing a nanowire according to a first exemplary embodiment of the present invention.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

Terms such as "first", "second", "third", and the like are used to explain a variety of different portions, different components, different regions, different layers, and/or different sections. However, it will be understood that the present invention is not limited to this. That is, the terms are used only to discriminate different portions, different components, different sections, different layers, or different sections. Therefore, in the following description, a first portion, a first region, a first layer, or a first section may be referred to as a second portion, a second region, a second layer, or a second section, respectively.

In the following description, the technical terms are used only to explain a specific exemplary embodiment while not limiting the present invention. The terms of a singular form may include plural forms unless referred to the contrary. The meaning of "include" specifies a property, a region, a fixed number, a step, a process, an element, and/or a component but does not exclude other properties, regions, fixed numbers, steps, processes, elements, and/or components.

Terms such as "under", "above", and the like that represent a relative space may be used to more easily describe a specific portion of a member illustrated in the drawings. It is intended that the terms include other meanings or operations as well as a specific meaning or operation illustrated in the drawings. For example, when a device illustrated in the drawings is turned over, a first portion that was described as being located under a second portion may be located above the second portion. Therefore, the meaning "under" includes both of upper and lower directions. The device may be rotated by 90° or other angles and thus the terms representing the relative space may be construed in accordance with the rotation of the device.

Although not specifically defined, all of the terms including the technical and scientific terms used herein have meanings understood by ordinary persons skilled in the art. The terms have specific meanings coinciding with related technical references and the present specification as well as lexical meanings. That is, the terms are not construed as overly ideal or formal meanings.

The embodiments of the present invention described with reference to perspective views and sectional views substantially represent the ideal embodiments of the present invention. Consequently, illustrations are expected to be variously modified, that is, manufacturing methods and/or specifications are expected to be modified. Thus, the embodiments are not limited to a particular form of illustrated regions and, for example, modifications of forms according to manufacturing are also included. For example, a region illustrated or described to be flat may generally be rough or have rough and nonlinear characteristics. Also, a portion illustrated to have a pointed angle may be rounded. Thus, regions illustrated on drawings are merely rough and broad, and their forms are not meant to be illustrated precisely nor meant to narrow the scope of the present invention.

In the specification, the term "nano" implies a nanoscale. In addition, the term "nanowire" implies a nanostructure formed in a wire shape.

FIG. 1 schematically shows an apparatus for manufacturing a nanowire 100 according to a first exemplary embodiment of the present invention. A structure of the apparatus for manufacturing a nanowire 100 of FIG. 1 is an example of the present invention, and it is not limited thereto. Therefore, the structure of the apparatus for manufacturing a nanowire 100 can be variously modified.

As shown in FIG. 1, a thermal chemical vapor deposition apparatus may be used as the apparatus for manufacturing a nanowire 100. That is, a nanowire is manufactured by thermal chemical action of a source gas. The apparatus for manufacturing a nanowire 100 includes a chamber 10, a susceptor 20 provided inside the chamber 10 to support a substrate S, a cooling pipe 30 inserted into the susceptor 20 to control the temperature of the susceptor 20, and a resistance heat wire 40 provided outside the chamber 10. The apparatus for manufacturing a nanowire 100 may further include other parts as necessary.

The chamber 10 may be formed of a quartz tube. The source gas is provided inside the chamber 10 and makes a nanowire grow on a substrate 22. For example, a silicon source gas is provided to grow a silicon nanowire. The silicon source gas may include a mono-silane ($SiH_4$) gas diluted with helium (He), another type of silicon source gas, or a diluted gas.

The susceptor 20 is provided inside the chamber 10. The silicon nanowire grows on the substrate 22. The substrate 22 may be silicon (Si), glass, quartz, indium-tin oxide (ITO), alumina ($Al_2O_3$), or stainless steel (SUS).

The cooling pipe 30 is inserted into the susceptor 20. The cooling pipe 30 penetrates the chamber 10 and supplies a cooling medium into the chamber 10. For example, the cooling medium may be air or cooling water. The cooling pipe 30 has a hollow space so that air or cooling water may inflow therein. In this case, the temperature of the susceptor 20 may be controlled by controlling inflow pressure, inflow speed, and inflow amount. When the temperature of the susceptor 20 is decreased, the substrate 22 is cooled. That is, the temperature of the substrate 22 is decreased as the inflow pressure of the air or cooling water is increased. The temperature of the substrate is controlled separately from the temperature of the silicon source gas. Therefore, the temperature of the substrate 22 may be independently controlled without regard to the temperature of the silicon source gas.

As shown in FIG. 1, the cooling pipe 30 includes a first cooling pipe portion 32 and a second cooling pipe portion 34. The first cooling pipe portion 32 is disposed inside and outside the chamber 10. The second cooling pipe portion 34 is inserted into the susceptor 20 inside the chamber 10. A pair of first cooling pipe portions 32 may be formed in a linear shape. The air or cooling water inflows through one first cooling pipe portion 32a of the pair of first cooling pipe portions 32, and the air or cooling water emits out through the other first cooling pipe portion 32b of the pair of first cooling pipe portions 32. Since a protection pipe 36 surrounds the first cooling pipe portions 32, the first cooling pipe portions 32 are not exposed to a high temperature environment of the chamber 10. Since the protection pipe 36 functions as a heat insulating material, the air or cooling water introduced through the first cooling pipe portion 32a is transmitted to the substrate 22 without being influenced by the high temperature environment of the chamber 10. The protection pipe 36 may be filled with air having low thermal conductivity or may be formed of a heat insulating material. In addition, the inside of the protection pipe 36 may be vacuumized.

The second cooling pipe portion 34 represented as the dotted line in FIG. 1 is formed in a direction that is parallel with a surface 201 of the susceptor 20, that is, the second cooling pipe portion 34 is formed in the xy plane direction. The second cooling pipe portion 34 may have a circular shape. Both ends of the second cooling pipe portion 34 are respectively connected with the first cooling pipe portions 32. Consequently, the air or cooling water introduced through the first cooling pipe portion 32a circulates through the second cooling pipe portion 34 and is then emitted through the other first cooling pipe portion 32b.

As shown in FIG. 1, the resistance heat wire 40 surrounds the chamber 10. The resistance heat wire 40 supplies heat to the chamber 10 to heat the silicon source gas inserted into the chamber 10 for pyrolysis reaction. In FIG. 1, the silicon source gas is heated by using the resistance heat wire 40, but the silicon source gas may be heated by using another method.

Figure 2:
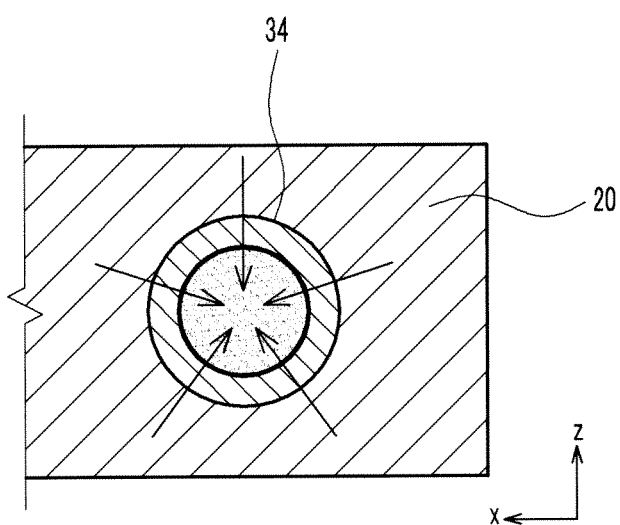
FIG. 2 is a schematic cross-sectional view of a susceptor of FIG. 1, taken along the line II-II.

FIG. 2 shows a cross-section structure of the susceptor 20, taken along the line II-II of FIG. 1.

As shown in FIG. 2, the air or cooling water flows through the second cooling pipe portion 34. Instead of directly contacting the susceptor 20, the air or cooling water cools the susceptor 20 by flowing along the second cooling pipe portion 34. Therefore, a problem such as explosion due to directly contact between the air or cooling water and the heated susceptor 20 can be prevented.

In FIG. 2, the arrow shows the heat moving path. As shown in FIG. 2, when the air or cooling water flows along the second cooling pipe portion 34, heat of the susceptor 20 is absorbed to the air or cooling water along the arrow direction. The air or cooling water is continuously circulated while absorbing the heat and then emitted out so that the susceptor 20 is cooled.

Figure 3:
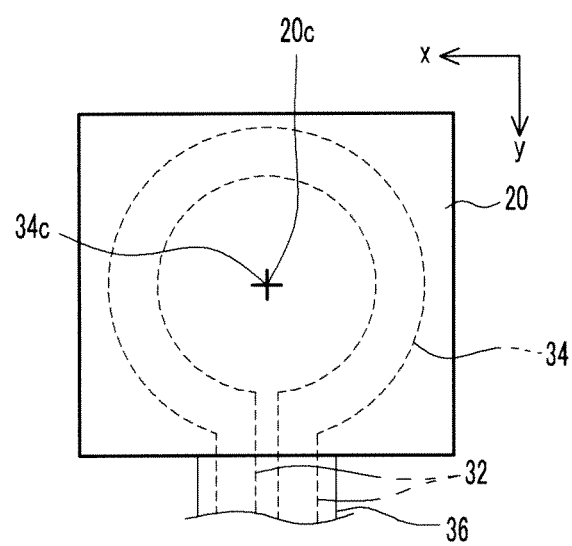
FIG. 3 is a top plan view of the susceptor of FIG. 1.

FIG. 3 schematically shows a top plan view of the susceptor 20 of FIG. 1.

As shown in FIG. 3, a center 34c of the second cooling pipe portion 34 matches a center 20c of the susceptor 20. Accordingly, the second cooling pipe portion 34 can uniformly reduce the temperature of the susceptor 20. Therefore, the silicon nanowire on the substrate 22 disposed on the susceptor 20 can be uniformly grown.

Figure 4:
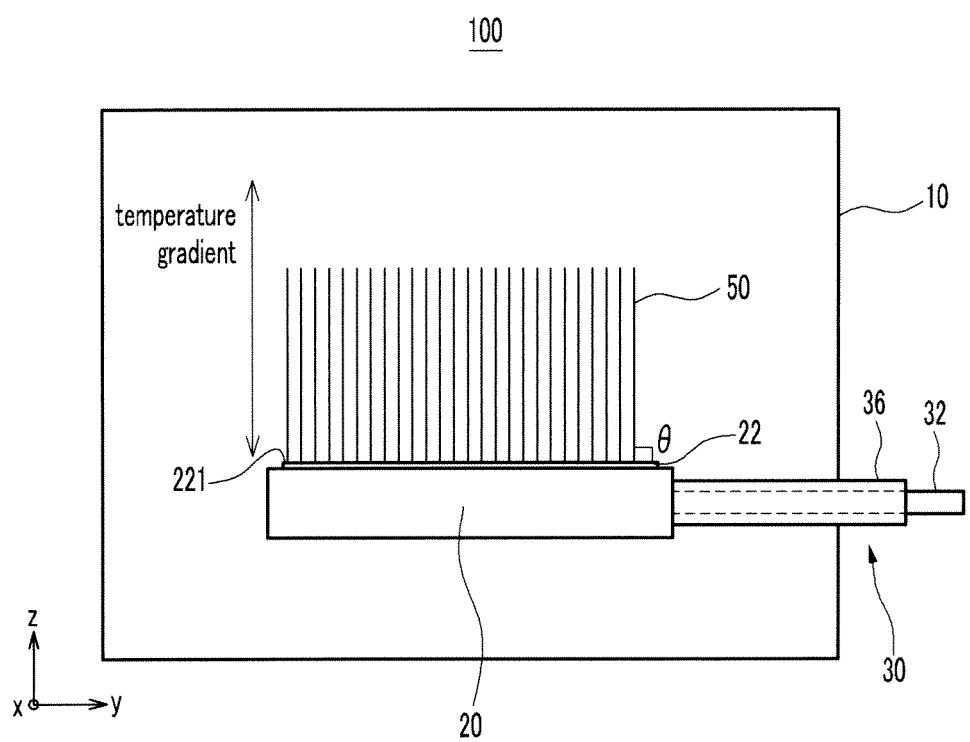
FIG. 4 is a schematic view of a growth process of the nanowires on a substrate of FIG. 1.

FIG. 4 schematically shows a growing process of a silicon nanowire 50 on the substrate 22 of FIG. 1.

As shown in FIG. 4, the internal temperature of the chamber 10 is high, but the temperature of the substrate 22 that is cooled by the susceptor 20 is relatively low. Therefore, a temperature gradient is generated in the z-axis direction from the substrate 22. Since the temperature gradient is substantially perpendicular to a substrate surface 221 of the substrate 22, the silicon nanowire 50 grows along a direction that is substantially perpendicular to the substrate surface 221 of the substrate 22. That is, an angle formed by the substrate surface 221 of the substrate 22 and the growth direction of the silicon nanowire 50 substantially becomes a right angle. Since the silicon nanowire 50 grown in the perpendicular direction is formed on the substrate 22, integration density of the silicon nanowires 50 can be maximized. Therefore, a device formed of the silicon nanowires can be used as a sensor or a light emitting diode by maximizing the surface area of the device. In addition, since the silicon nanowire 50 is perpendicularly formed, electron movement distance is decreased so that an electron device having high efficiency with low power consumption can be manufactured.

The size and direction of the temperature gradient may be arbitrarily controlled according to a design and a processing condition thereof. In addition, the growth direction and speed of the silicon nanowire that grows corresponding to the temperature gradiation may be arbitrarily controlled.

Hereinafter, a manufacturing method of the silicon nanowire 50 will be described with reference FIG. 4. The manufacturing method of the silicon nanowire 50 is an example of the present invention, and it is not limited thereto.

The chamber 10 in which the susceptor 20 is received is internally heated through the external resistance heating wire 40 (shown in FIG. 1) of the chamber 10, and the silicon source gas is supplied into the chamber 10. In this case, the air or cooling water flows through the cooling pipe 30 to maintain the temperature of the substrate 22 disposed on the susceptor 20 to be lower than the internal temperature of the chamber 10 while decreasing the temperature of the susceptor 20. The temperature gradient can be generated in a desired direction on the substrate surface 221 of the substrate 22 by controlling the temperature of the substrate 22.

Through pyrolysis and catalysed vapor-liquid-solid (VLS) reaction of the silicon source gas, the silicon nanowire 50 grows on the substrate 22. The silicon nanowire 50 grows in a direction of the temperature gradient with respect to the substrate surface 221 of the substrate 22, that is, a direction (+z-axis direction) that is substantially perpendicular to the substrate surface 221 if the temperature gradient is perpendicularly formed.

The size of the temperature gradient on the substrate 22 is proportional to the amount of air or cooling water introduced through the cooling pipe 30 and pressure of the silicon source gas in the chamber 10. That is, as the introduced amount of air or cooling water is increased, the temperature of the substrate 22 disposed on the susceptor 20 is decreased and the temperature gradient of the substrate 22 is gradually increased. In addition, when the pressure of the silicon source gas in the chamber 10 is increased, the heat transfer effect is increased by gas molecules and therefore the temperature gradient of the substrate 22 is further increased as the temperature of the substrate 22 is decreased.

In general, a temperature difference between the substrate 22 and the silicon source gas is maintained within 100° C. to 200° C. When the temperature difference is lower than 100° C., the temperature gradient is small so that the silicon nanowire cannot grow vertically on the substrate 22. When the temperature difference is higher than 200° C., the chamber 10 may be overheated or deposition may be greatly increased due to the silicon source gas so that the silicon nanowire may hardly grow. In addition, in order to cool the substrate 22 for the temperature difference between the substrate 22 and the chamber 10 to exceed 200° C., the pressure of the air or cooling water introduced to the cooling pipe 30 and pressure inside the chamber 10 should be increased. In this case, the process stability is significantly decreased. The temperature difference between the substrate and the silicon source gas may be substantially maintained at 130° C.

Here, the temperature of the substrate is higher than 0° C. and lower than 600° C.

When the temperature of the substrate 22 is lower than 0° C., the silicon nanowire hardly grows. In addition, when the temperature of the substrate 22 is higher than 600° C., the temperature gradient cannot be formed on the substrate 22. In addition, as the temperature of the substrate 22 is increased, the number of types of materials that can be used as the substrate is reduced and therefore it is preferred that the temperature of the substrate 22 is maintained to be lower than 600° C. Therefore, the temperature of the substrate 22 is maintained within the above-described range.

Figure 5:
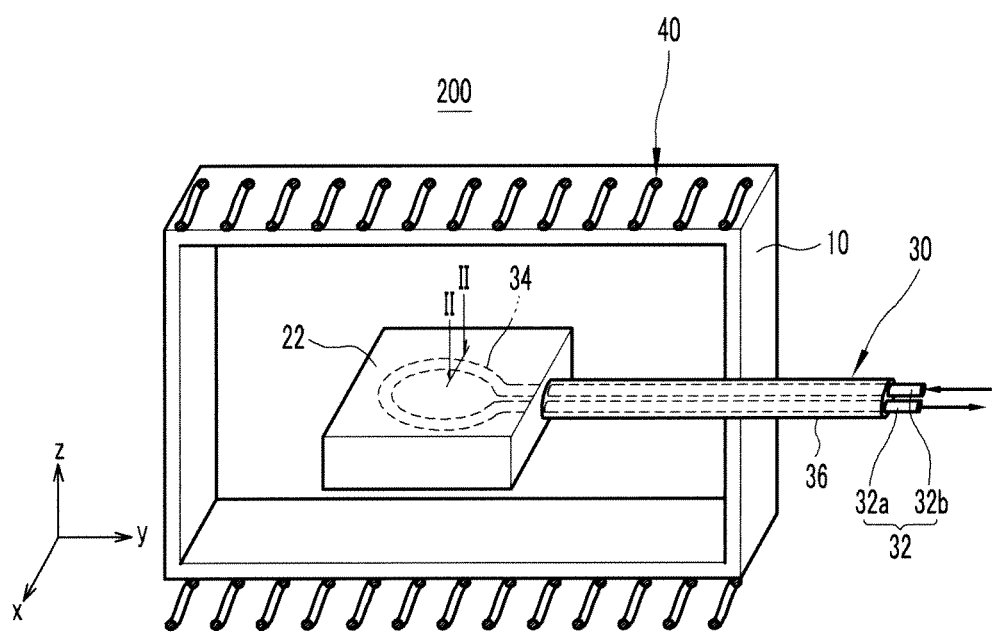
FIG. 5 is a schematic view of an apparatus for manufacturing a nanowire according to a second exemplary embodiment of the present invention.

FIG. 5 schematically shows an apparatus for manufacturing a nanowire 200 according to a second exemplary embodiment of the present invention.

Since the apparatus for manufacturing a nanowire 200 of FIG. 5 is similar to the apparatus for manufacturing a nanowire 100 of FIG. 1, like reference numerals designate like elements and detailed description thereof will be omitted.

As shown in FIG. 5, a substrate 22 may be directly cooled by inserting a cooling pipe 30 into the substrate 22. In this case, since the substrate 22 can be directly cooled by using air or cooling water flowing through the cooling pipe 30, temperature gradient can be more efficiently formed on the substrate 22.

Hereinafter, the present invention will be described in further detail with reference to experimental examples. The experimental examples are provided as examples of the present invention, and therefore the present invention is not limited thereto.

Experimental Example 1

A silicon substrate is disposed on a susceptor installed in a chamber. Silicon oxide is formed on the silicon substrate. A cooling pipe is inserted into the susceptor and is externally drawn out. Pressure in the chamber is controlled to 50 Torr, and air at room temperature is blown into the cooling pipe with a pressure of 80 psi. The silicon substrate is cooled with the air flowing through the cooling pipe while maintaining the chamber at a high temperature after inserting monosilane ($SiH_4$) gas therein.

Result of Experimental Example 1

Figure 6:
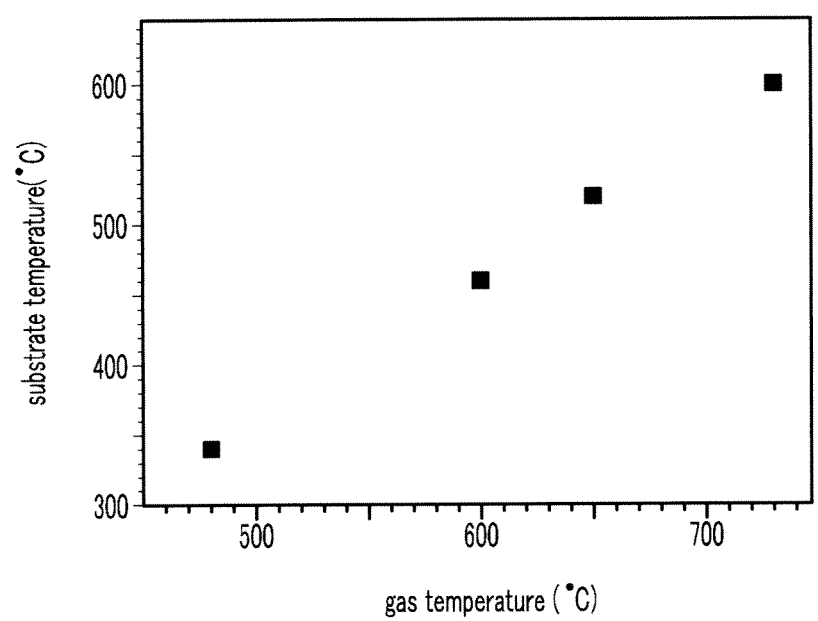
FIG. 6 is a graph of estimated values of substrate temperature and gas temperature according to Experimental Example 1 of the present invention.

FIG. 6 is a graph showing substrate temperature and gas temperature respectively measured according to Experimental Example 1 of the present invention.

As shown in FIG. 6, the gas temperature is increased as the inner wall temperature of the chamber is increased, and accordingly the substrate temperature is gradually increased. In the cases in which the gas temperature in the chamber was 460° C., 600° C., 650° C., and 730° C., respectively, the substrate temperature was 340° C., 460° C., 520° C., and 600° C., respectively. Therefore, a difference between the gas temperature and the substrate temperature was 120° C., 140° C., 130° C., and 130° C., respectively. While maintaining the above-described temperature difference, a silicon nanowire grows on the substrate. The substrate temperature was approximately 130° C. higher than the gas temperature in the chamber as an average.

Figure 7:
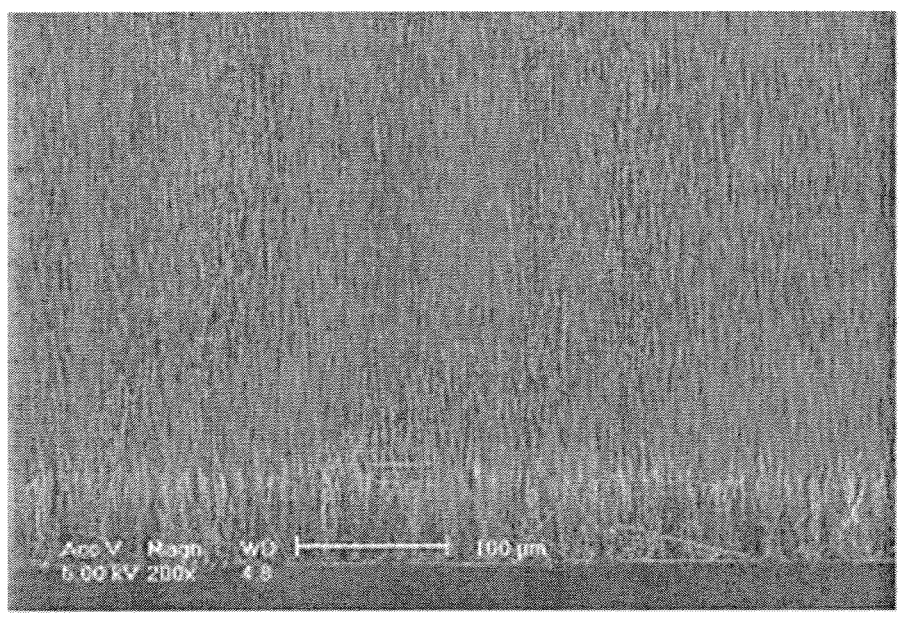
FIG. 7 and FIG. 8 are scanning electron microscope photos of nanowires manufactured according to Experimental Example 1 of the present invention.
Figure 8:
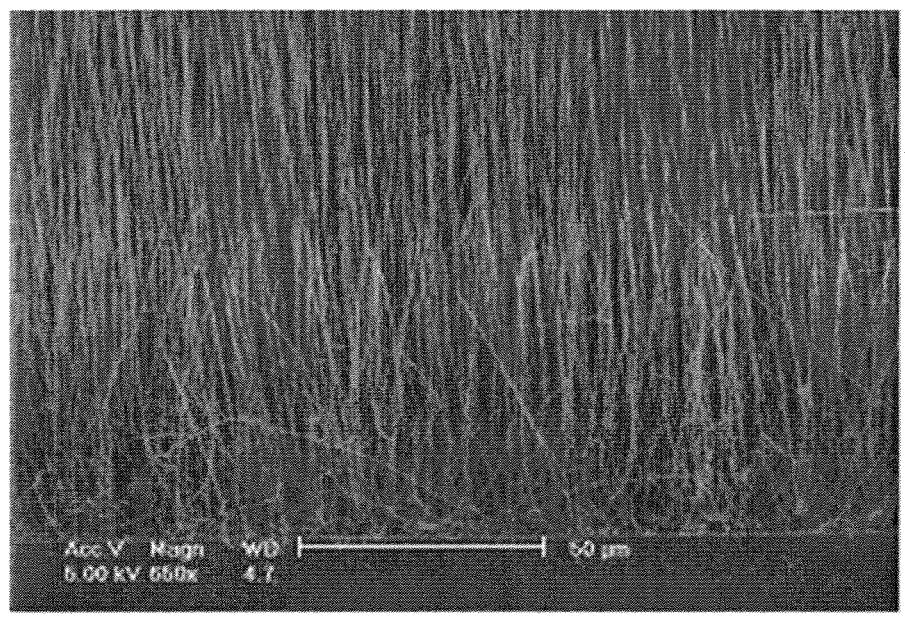

FIG. 7 and FIG. 8 respectively show scanning electron microscope photos of the nanowire according to Experimental Example 1 of the present invention. Here, FIG. 8 is an enlarged view of FIG. 7.

As shown in FIG. 7 and FIG. 8, the silicon nanowire could be formed in a direction of the temperature gradient formed on the substrate by using a silicon substrate on which a silicon oxide layer is to be formed. That is, the silicon nanowire could grow in a direction that is perpendicular to the surface of the substrate.

Figure 9:
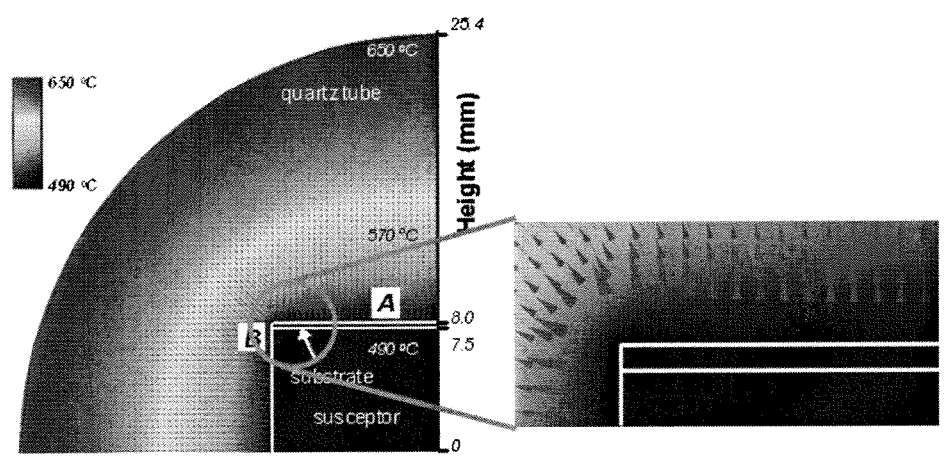
FIG. 9 shows a calculation result of temperature distribution and temperature gradient according to a location of each portion of the substrate in Experimental Example 1 of the present invention.

FIG. 9 shows a calculation result of temperature distribution and temperature gradient according to a location of each portion of the substrate in Experimental Example 1 of the present invention. FIG. 9 shows temperature gradient at a corner of the substrate.

As shown in FIG. 9, a temperature gradient area is clearly formed outside the substrate. In FIG. 9, the temperature gradient in a center area of a substrate marked as A and the temperature gradient in a corner area of a substrate marked as B are different from each other in direction and size. This can be checked from a growth form of the silicon nanowire in the A and B regions through FIG. 10 and FIG. 11.

Figure 10:
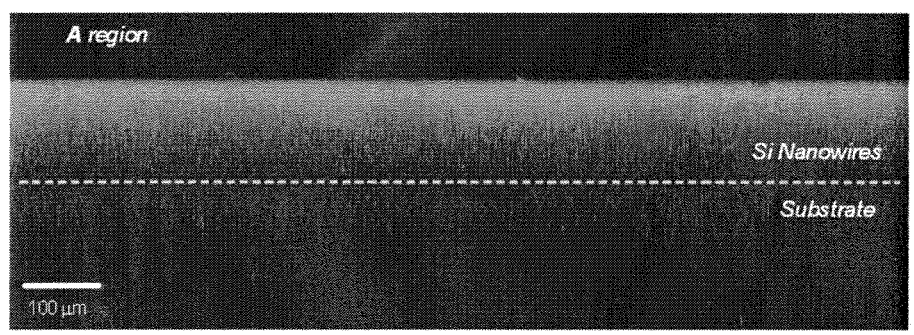
FIG. 10 and FIG. 11 respectively show scanning electron microscope photos of the nanowires in the A and B regions of FIG. 9.
Figure 11:
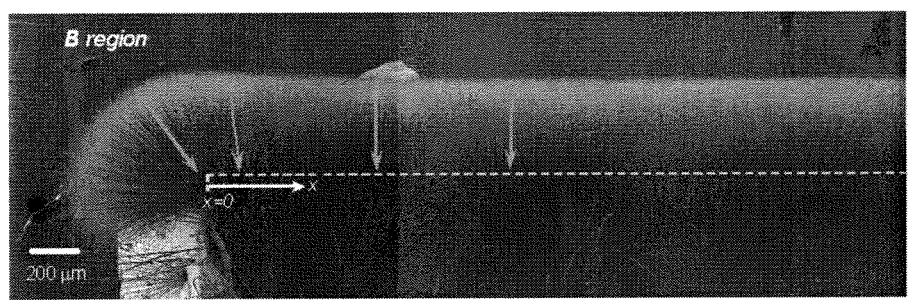
Figure 12:
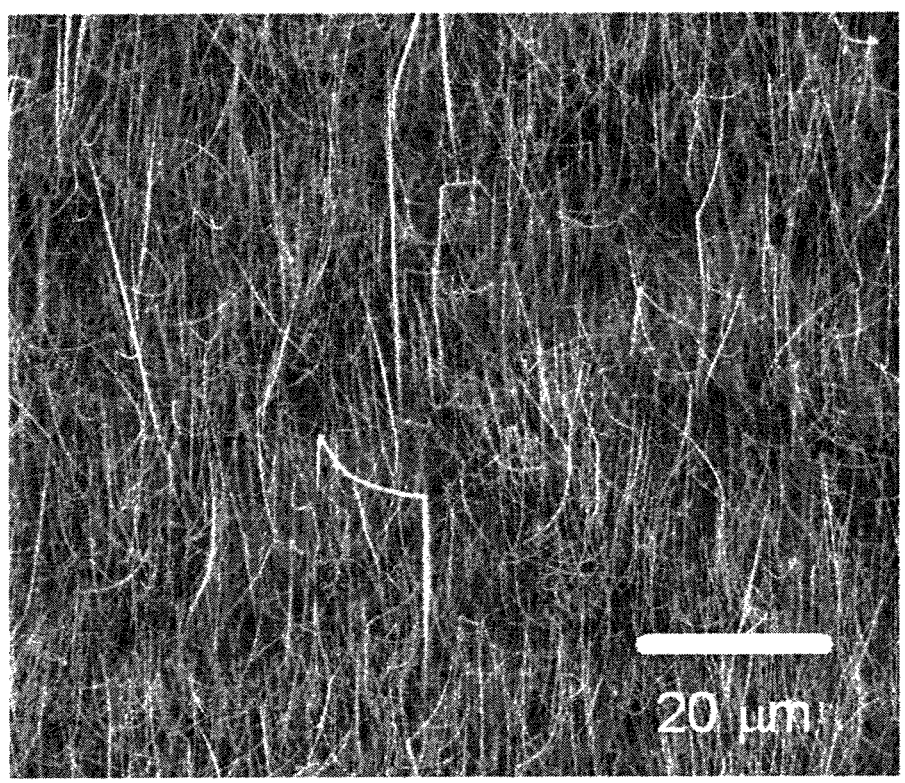
FIG. 12 to FIG. 15 respectively show scanning electron microscope photos of nanowires respectively manufactured according to Experimental Example 2 to Experimental Example 5 of the present invention.
Figure 13:
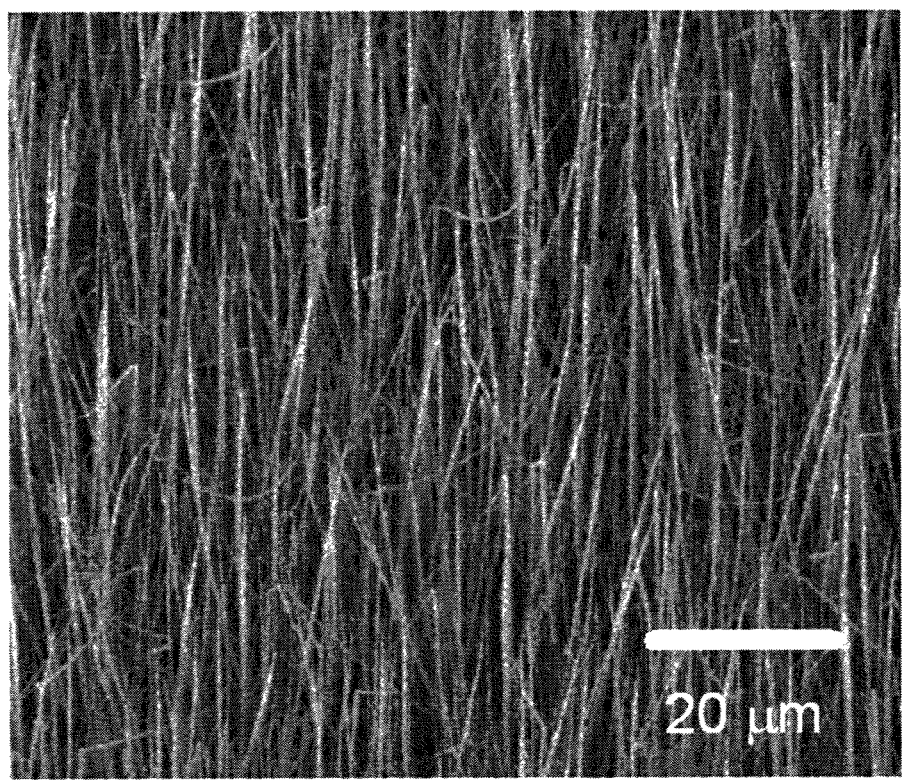
Figure 14:
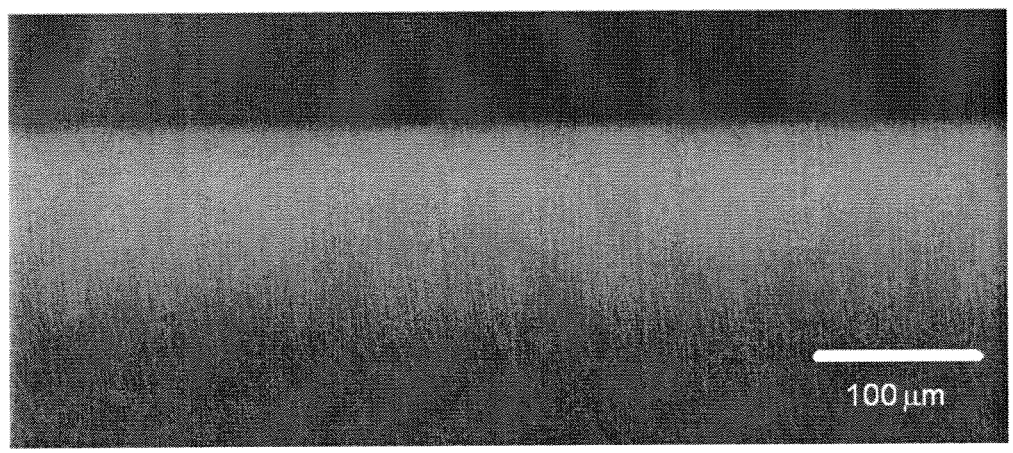
Figure 15:
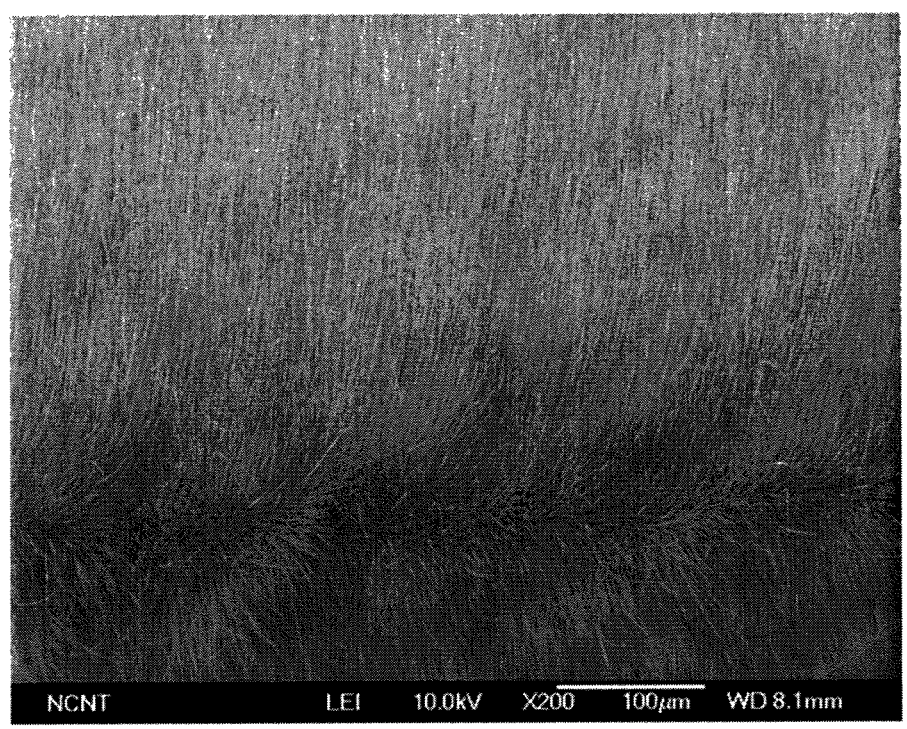

FIG. 10 and FIG. 11 respectively show scanning electron microscope photos of the nanowire in the A and B regions of FIG. 9.

As shown in FIG. 10, the temperature gradient is perpendicularly formed in the A region. Accordingly, the silicon nanowire has grown in a direction that is perpendicular to the surface of the substrate.

In addition, as shown in FIG. 11, the temperature gradient is obliquely formed in the B region. Accordingly, the silicon nanowire has grown obliquely in a direction that is the same as the temperature gradient. In addition, although the growth time period is the same, a nanowire in the B region of which the temperature gradient is relatively large is formed longer than a nanowire in the A region. Therefore, the growth direction and the growth length of the silicon nanowire are directly proportional to the numerically estimated temperature gradient direction and temperature gradient size on the substrate.

The temperature gradient size and direction can be arbitrarily controlled according to design and process conditions of the apparatus. Consequently, the growth direction and growth speed of the nanowire that grows corresponding to the temperature gradient size and direction can be arbitrarily controlled.

Experimental Example 2

Indium tin oxide (ITO) was used as a substrate material, and a silicon nanowire grew on the substrate. The rest of the experimental conditions are the same as those of Experimental Example 1.

Experimental Example 3

Quartz was used as a substrate material, and a silicon nanowire grew on the substrate. The rest of the experimental conditions are the same as those of Experimental Example 1.

Experimental Example 4

Alumina ($Al_2O_3$) was used as a substrate material, and a silicon nanowire grew on the substrate. The rest of the experimental conditions are the same as those of Experimental Example 1.

Experimental Example 5

Stainless steel (SUS) was used as a substrate material, and a silicon nanowire grew on the substrate. The rest of experimental conditions are the same as those of Experimental Example 1.

Results of Experimental Example 2 to Experimental Example 5

FIG. 12 to FIG. 15 respectively show scanning electron microscope photos of nanowires respectively manufactured according to Experimental Example 2 to Experimental Example 5 of the present invention.

As shown in FIG. 12 to FIG. 15, although various materials other than a silicon material are used for the substrate, the growth direction of the nanowire can be controlled by using the temperature gradient, and accordingly the nanowire can be perpendicularly grown in the substrate.

Since a silicon nanowire having constant directivity grows insufficiently on a substrate where an oxide layer is formed, the oxide layer should be eliminated for growth of the silicon nanowire. However, as described in Experimental Example 1 and Experimental Example 2 of the present invention, when the temperature gradient is formed on the substrate, the silicon nanowire can be formed not only on the oxide layer but also on a substrate formed of various materials by arbitrarily controlling the growth direction of the silicon nanowire. Consequently, various substrates that correspond to the purpose of use with low cost can be selected.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method for manufacturing a nanowire comprising:
providing a silicon source gas in a chamber;
controlling the temperature of a substrate received in the chamber separately from the temperature of the source gas, the substrate being formed of a material selected from the group consisting of silicon (Si), glass, quartz, indium-tin oxide (ITO), alumina (Al2O3), and stainless steel (SUS);
heating the chamber using a heat source that surrounds the chamber both above and below the substrate;
cooling the substrate to form a temperature gradient on the substrate perpendicular to the substrate, wherein the substrate is cooled by providing a cooling medium to indirectly contact a susceptor that is located in a lower portion of the substrate for supporting the substrate; and
forming a silicon nanowire directly on the substrate, the silicon nanowire being grown in a direction perpendicular to the substrate and having at least one growth condition selected from the group consisting of growth speed and growth direction controlled according to the temperature gradient on the substrate.

2. The method for manufacturing a nanowire of claim 1, wherein the temperature gradient is formed by controlling at least one condition selected from the group consisting of introduction pressure, introduction speed, and the amount of introduction of the cooling medium.

3. The method for manufacturing a nanowire of claim 1, wherein a temperature difference between the substrate and the source gas is within 100° C. to 200° C.

4. The method for manufacturing a nanowire of claim 3, wherein the temperature difference between the substrate and the source gas is substantially 130° C.

5. The method for manufacturing a nanowire of claim 1, wherein, in the forming of the nanowire on the substrate, the temperature of the substrate is higher than 0° C. and lower than 600° C.

6. A method for manufacturing a nanowire comprising:
providing a silicon source gas in a chamber;
controlling the temperature of a substrate received in the chamber separately from the temperature of the source gas, the substrate being formed of a substrate material selected from the group consisting of silicon (Si), glass, quartz, indium-tin oxide (ITO), alumina (Al2O3), and stainless steel (SUS), directly on the substrate material, the substrate having a first surface and an oppositely disposed second surface;
heating the chamber using a heat source that surrounds the chamber both above and below the substrate;
cooling the substrate to form a temperature gradient on the substrate perpendicular to the substrate, wherein the substrate is cooled by providing a cooling medium to indirectly contact the second surface of the substrate; and
forming a silicon nanowire directly on the first surface of the substrate, the silicon nanowire being grown in a direction perpendicular to the substrate and having at least one growth condition selected from the group consisting of growth speed and growth direction controlled according to the temperature gradient on the substrate,
wherein the temperature of the substrate is between 0 ° C. and 600° and a temperature difference between the source gas and the substrate is 100° C. to 200 C.

7. A method for manufacturing a nanowire comprising:
providing a silicon source gas in a chamber;
controlling the temperature of a substrate received in the chamber separately from the temperature of the source gas, the substrate being formed of a material selected from the group consisting of silicon (Si), glass, quartz, indium-tin oxide (ITO), alumina (Al2O3), and stainless steel (SUS), wherein the chamber has a first end in which the substrate is disposed and a second end opposite the first end;
heating the chamber using a heat source that surrounds the chamber around both the first and second ends of the chamber;
cooling the substrate to form a temperature gradient on the substrate perpendicular to the substrate, wherein the substrate is cooled by providing a cooling medium to indirectly contact a susceptor that is located in a lower portion of the substrate for supporting the substrate; and
forming a silicon nanowire directly on the substrate, the silicon nanowire being grown in a direction perpendicular to the substrate and having at least one growth condition selected from the group consisting of growth speed and growth direction controlled according to the temperature gradient on the substrate. substrate.

* * * * *